United States Patent
Cheng et al.

(10) Patent No.: US 8,703,553 B2
(45) Date of Patent: Apr. 22, 2014

(54) MOS CAPACITORS WITH A FINFET PROCESS

(75) Inventors: Kangguo Cheng, Schenectady, NY (US); Balasubramanian S. Haran, Watervliet, NY (US); Shom Ponoth, Clifton Park, NY (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/471,955

(22) Filed: May 15, 2012

(65) Prior Publication Data

US 2013/0309832 A1 Nov. 21, 2013

(51) Int. Cl.
*H01L 21/8234* (2006.01)
*H01L 27/12* (2006.01)

(52) U.S. Cl.
CPC ........ *H01L 27/1288* (2013.01); *H01L 27/1211* (2013.01); *H01L 21/823431* (2013.01)
USPC ........... 438/155; 438/251; 438/394; 257/304; 257/350

(58) Field of Classification Search
USPC .................................. 438/381; 257/E21.008
See application file for complete search history.

(56) References Cited

U.S. PATENT DOCUMENTS

| | | | |
|---|---|---|---|
| 6,995,412 B2 | 2/2006 | Fried et al. | |
| 7,091,551 B1 | 8/2006 | Anderson et al. | |
| 7,274,053 B2 | 9/2007 | Anderson et al. | |
| 7,291,877 B2 | 11/2007 | Brederlow et al. | |
| 7,566,613 B2 | 7/2009 | Furukawa et al. | |
| 7,635,893 B2 | 12/2009 | Weis et al. | |
| 7,696,040 B2 | 4/2010 | Zhu | |
| 2003/0193058 A1* | 10/2003 | Fried et al. | 257/200 |
| 2005/0275922 A1 | 12/2005 | Anderson et al. | |
| 2007/0018239 A1 | 1/2007 | Chen et al. | |
| 2008/0237678 A1 | 10/2008 | Datta et al. | |
| 2011/0175152 A1* | 7/2011 | Booth et al. | 257/306 |
| 2011/0298025 A1* | 12/2011 | Haensch et al. | 257/296 |
| 2012/0199812 A1* | 8/2012 | Baykan et al. | 257/13 |

* cited by examiner

*Primary Examiner* — Olik Chaudhuri
*Assistant Examiner* — Christine Enad
(74) *Attorney, Agent, or Firm* — Tutunjian & Bitetto, P.C.; Vazken Alexanian (57) ABSTRACT

Methods for capacitor fabrication include doping a capacitor region of a semiconductor layer in a semiconductor-on-insulator substrate; partially etching the semiconductor layer to produce a first terminal layer comprising doped semiconductor fins on a remaining base of doped semiconductor; forming a dielectric layer over the first terminal layer; and forming a second terminal layer over the dielectric layer in a finFET process.

20 Claims, 9 Drawing Sheets

MOS CAPACITORS WITH A FINFET PROCESS

BACKGROUND

1. Technical Field

The present invention relates to capacitor fabrication and, more particularly, to forming finned capacitors as part of a fin field effect transistor fabrication process.

2. Description of the Related Art

Decoupling capacitors are used to shield circuit elements from noise generated by other circuit elements. Noise is directed through the capacitor, reducing the effect it has elsewhere. For example, changing power demands for a device may manifest as changing current demand. When the current demand for a device changes, the power supply does not respond instantly and, as a result, voltage at the device changes until the power supply can adapt. When events take place that have a frequency higher than what can be accommodated by a voltage regulator, noise occurs. The decoupling capacitor works as backup energy storage. If voltage drops, the capacitor can quickly provide the shortfall for a short period of time within a given frequency range.

When using decoupling capacitors on integrated circuits (ICs), it is advantageous to place capacitors close to the devices they serve. However, previous circuit designs for decoupling capacitors substantially increase the number of steps used in the fabrication process and do not benefit from the steps used to create nearby fin field effect transistors.

SUMMARY

A method for capacitor fabrication includes doping a capacitor region of a top semiconductor layer in a semiconductor-on-insulator substrate; partially etching the doped semiconductor layer to produce a first terminal layer comprising a plurality of doped semiconductor fins on a remaining base of doped semiconductor; forming a dielectric layer over the first terminal layer; and forming a second terminal layer over the dielectric layer having a shape that conforms to the doped semiconductor fins.

A further method for capacitor fabrication includes doping a capacitor region of a semiconductor layer in a semiconductor-on-insulator (SOI) substrate; oxidizing a surface of a transistor region of the semiconductor layer to produce an oxidized layer; etching the oxidized layer to produce fins of oxidized semiconductor; partially etching the semiconductor layer to produce a first terminal layer in the capacitor region comprising a plurality of doped semiconductor fins on a remaining base of doped semiconductor and to produce undoped semiconductor fins in the transistor region; forming a gate stack over the capacitor region and the transistor region that includes a dielectric layer and a gate layer that conforms to the doped semiconductor fins; and isolating the capacitor region from the transistor region.

A further method for capacitor fabrication is shown that includes doping a capacitor region of a semiconductor layer in a semiconductor-on-insulator (SOI) substrate that has a masking layer; oxidizing a surface of a transistor region of the semiconductor layer to produce an oxidized layer; forming a fin mask on the capacitor region and the transistor region respectively by patterning a masking material on the respective regions; etching the oxidized layer to produce fins of oxidized semiconductor; etching the masking layer in the capacitor region; partially etching the semiconductor layer with a timed anisotropic etch to produce a first terminal layer in the capacitor region comprising a plurality of doped semiconductor fins on a remaining base of doped semiconductor and to produce undoped semiconductor fins in the transistor region; removing the fin masks; forming a gate stack over the capacitor region and the transistor region that includes a dielectric layer and a gate layer having a shape that conforms to the doped semiconductor fins; isolating the capacitor region from the transistor region; and forming electrical contacts on the first terminal layer and the gate layer of the capacitor region respectively.

A capacitor includes a first electrical terminal comprising a plurality of fins formed from doped semiconductor on a top layer of doped semiconductor on a semiconductor-on-insulator substrate; a second electrical terminal comprising an undoped material having bottom surface shape that is complementary to the first electrical terminal, such that an interface area between the first electrical terminal and the second electrical terminal is larger than a capacitor footprint; and a dielectric layer separating the first and second electrical terminals.

An integrated circuit is shown that includes at least one capacitor and at least one transistor. The at least one capacitor includes a first electrical terminal comprising a plurality of fins from doped semiconductor on a top layer of doped semiconductor on a semiconductor-on-insulator substrate; a second electrical terminal comprising an undoped material having a bottom surface shape that is complementary to the first electrical terminal such that an interface area between the first electrical terminal and the second electrical terminal is larger than a capacitor footprint; and a dielectric layer separating the first and second electrical terminals. The at least one transistor includes one or more fins, each having a semiconductor layer and an oxide layer; a gate comprising the undoped material, having a surface shape that is complementary to the one or more fins; and a dielectric layer separating the one of more fins and the gate.

An integrated circuit includes at least one capacitor formed on an insulator layer of a substrate and at least one transistor formed on the insulator layer of the substrate. The at least one capacitor includes a first electrical terminal comprising a plurality of fins formed from doped semiconductor on a layer of the doped semiconductor; a second electrical terminal comprising an undoped material having a bottom surface shape that is complementary to the first electrical terminal such that an interface area between the first electrical terminal and the second electrical terminal is larger than a capacitor footprint; and a high-k dielectric layer separating the first and second electrical terminals. The at least one transistor includes one or more fins, each having a semiconductor layer and an oxide layer; a gate comprising the undoped material, having a surface shape that is complementary to the one or more fins; and a high-k dielectric layer separating the one of more fins and the gate. A fin height of the at least one transistor is smaller than a combined height of the fins of the at least one capacitor and the layer of doped semiconductor.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The operation of decoupling capacitors is such that it is advantageous to place the capacitor as close as possible to a device that uses the decoupled signal. The longer the transmission line between the decoupling capacitor and the device, the larger the inductance, and a large inductance slows the response of the capacitor. It is therefore helpful to integrate the decoupling capacitors directly with an integrated circuit, such that the distance is minimized.

The present principles provide for the integration of decoupling capacitors in metal-oxide semiconductor (MOS) fin field effect transistor (FET) processes. In particular, the present principles form a doped region on a substrate to form one capacitor element and partially forms fins on the doped substrate to increase the capacitor area, without increasing the capacitor's footprint on the chip.

Increasing conductor area in a capacitor provides a corresponding increase in capacitance. This, along with the use of dielectric materials having a high k factor, such as hafnium silicate, hafnium dioxide, zirconium silicate, and zirconium dioxide, provides highly effective capacitors that may be placed in any layout and with arbitrarily close proximity to device elements Furthermore, forming the decoupling capacitors as part of the FET fabrication process provides a substantial decrease in cost and fabrication time.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
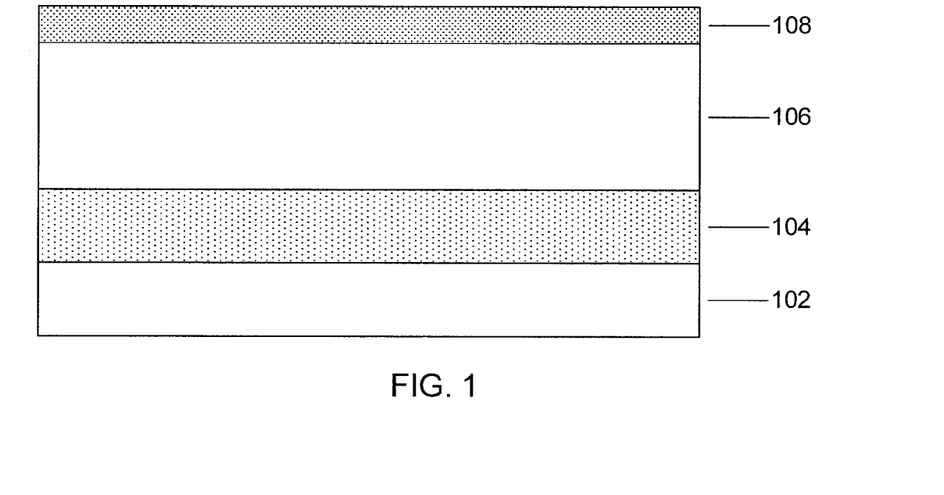
FIG. 1 is a cross-sectional view of a silicon-on-insulator substrate in accordance with the present principles.

Referring now to the drawings in which like numerals represent the same or similar elements and initially to FIG. 1, a semiconductor-on-insulator substrate is formed. A bulk substrate 102 is formed from some suitable material including, for example, bulk silicon, geranium, or a combination of materials. A dielectric layer 104 is formed on the bulk substrate 102. The dielectric layer insulates the substrate 102 from active device components formed above and may be formed from, e.g., silicon dioxide or any other appropriate insulating or dielectric material. A semiconductor layer 106 is formed on the insulation layer 104 and may be formed from any appropriate semiconductor, such as silicon, germanium, or a combination of materials. A masking layer 108 is formed on the semiconductor layer 106 using, for example, low-pressure chemical vapor deposition. The masking layer may be formed from, e.g., a silicon nitride or any other appropriate substance.

The thickness of the semiconductor layer 106 should be larger than a desired final fin height. In the present exemplary embodiment, the semiconductor layer 106 is 90 nm. The thickness of the masking layer 108, the insulator layer 104, and the bulk substrate 102 may be chosen according to the particular needs of the integrated circuit, including structural considerations for other circuit components on the chip.

Figure 2:
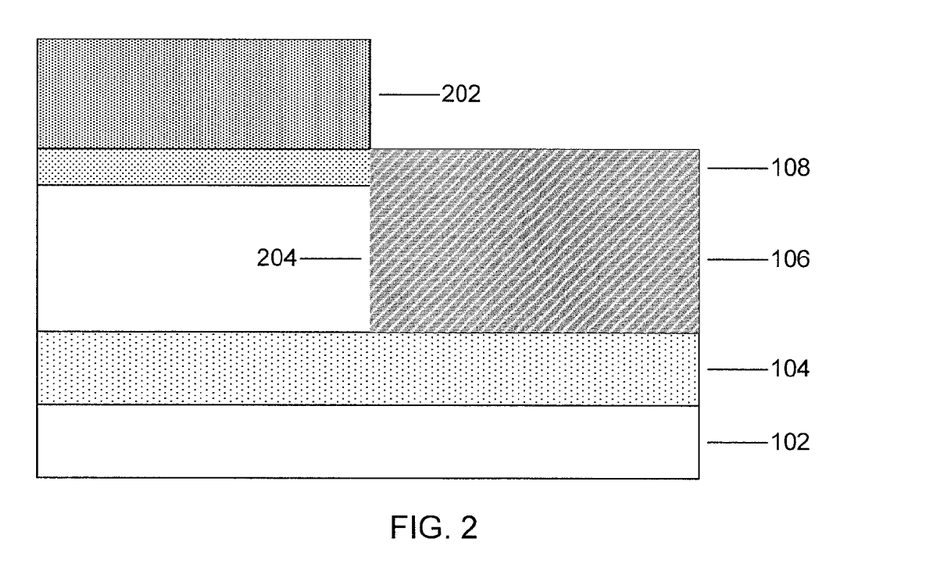
FIG. 2 is a cross-sectional view of a doping step in the formation of a decoupling capacitor in accordance with the present principles.
Figure 3:
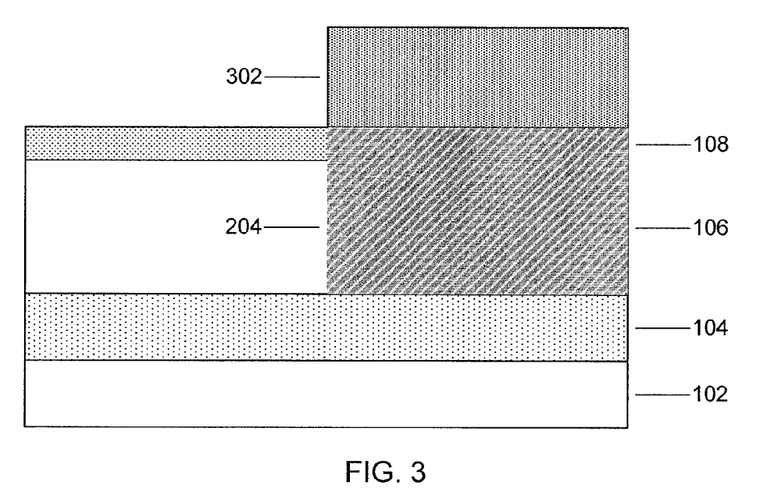
FIG. 3 is a cross-sectional view of photoresist patterning in the formation of a decoupling capacitor in accordance with the present principles.

Referring now to FIG. 2, a light-sensitive photoresist 202 is patterned on mask 108. The resist 202 blocks off a portion of the semiconductor layer 106 that will eventually form fin FETs and may be formed from, e.g., poly(methyl methacrylate) or SU-8. On the uncovered regions, well doping is used on the area that will form a decoupling capacitor. In particular, a doped region 204 is formed by implanting a dopant during an annealing process. In one exemplary embodiment, this may include implanting phosphorous, but it should be understood that any appropriate dopant of any type may be used. For example, either an N-type dopant, such as phosphorous, or a P-type dopant, such as boron, may be used, with the only functional effect being a change in the polarity of the terminals of the decoupling capacitor. As such, in some embodiments the selection of dopant will depend on the dopant used in other circuit components Referring now to FIG. 3, the resist 202 is removed and a new resist 302 is formed over the capacitor area. The old resist 202 may be removed using a solvent or stripper appropriate for the particular kind of resist used. For example, in the case of SU-8, gamma butyrolactone may be used as a solvent. The new resist 302 may be formed from the same material as the old resist 202 or may optionally be formed from a different resist material. This may be particularly helpful if other circuit components or processes on the chip use a different resist process. Removing resist 22 exposes an area for fin FET processing.

Figure 4:
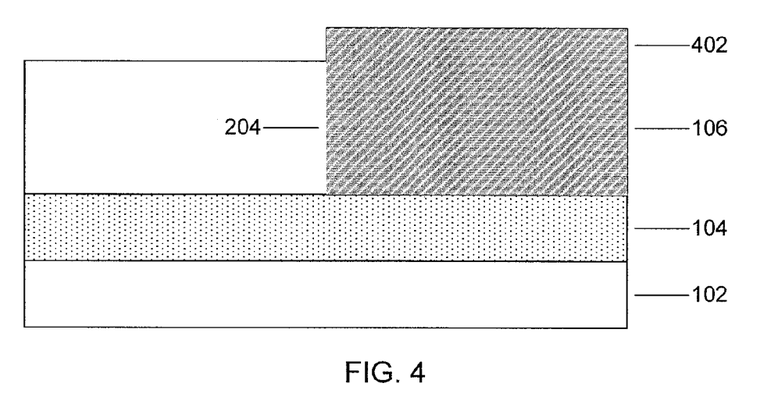
FIG. 4 is a cross-sectional view of mask etching in the formation of a decoupling capacitor in accordance with the present principles.

Referring now to FIG. 4, the masking layer 108 is patterned to remove masking material 108 over the FET section, leaving a portion 402 of the masking material behind. The mask material may be removed using a dry etch, such as reactive ion etching (RIE). The resist 302 is removed as described above, exposing the remaining masking material 402.

Figure 5:
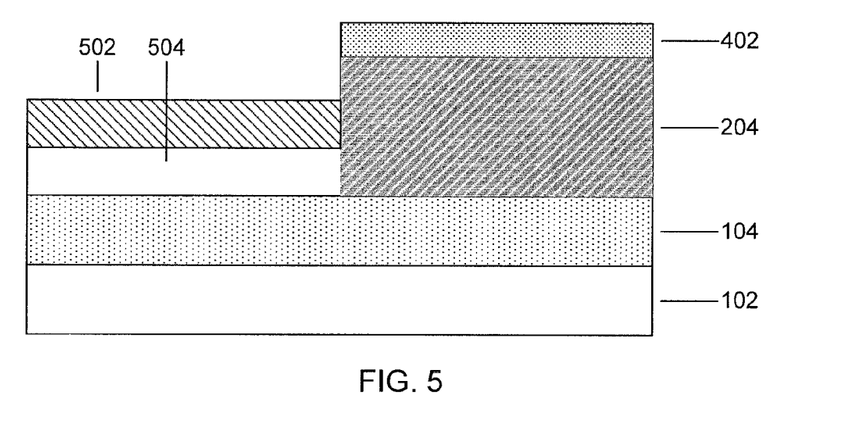
FIG. 5 is a cross-sectional view of an oxidizing step in the formation of a decoupling capacitor in accordance with the present principles.

Referring now to FIG. 5, oxidation is performed in the fin FET area. This may be performed by exposing the exposed silicon layer 106 to a concentrated oxygen gas or to an oxidizing liquid, such as water. Thermal oxidation may be used, which forces the oxidizing agent to diffuse into the surface at a high temperature. For example, in the case of forming a silicon dioxide, thermal oxidation may be performed at a temperature between about 800 and 1200 degrees Celsius. This produces an oxidized layer 502 formed from, e.g., silicon dioxide. The oxidation process causes growth in the top layer 502, so the thickness of the oxidized layer 502 may be adjusted by, e.g., a wet etch. In the present example, the thickness of the oxide layer 502 may be about 10-30 nm. The oxidation process leaves a portion of unoxidized material 504 beneath the oxidized layer 502 having an exemplary thickness of about 30 nm.

Figure 6:
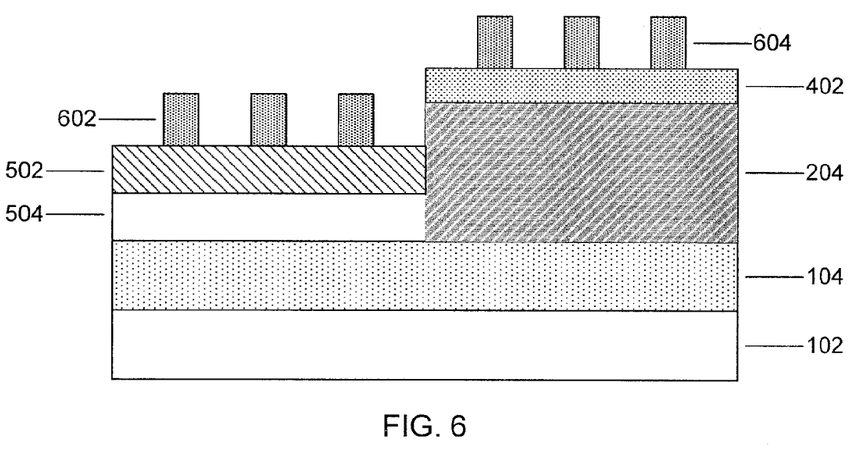
FIG. 6 is a cross-sectional view of patterning a fin photoresist in the formation of a decoupling capacitor in accordance with the present principles.

Referring now to FIG. 6, fin locations are patterned onto the surfaces 502 and 402 by laying down photoresist masks 602 (for FET regions) and 604 (for capacitor regions). As noted above, the photoresist masks 602 and 604 may be formed from any appropriate photoresist material such as, e.g., poly(methyl methacrylate) or SU-8. These masks protect the underlying material during fin formation.

Figure 7:
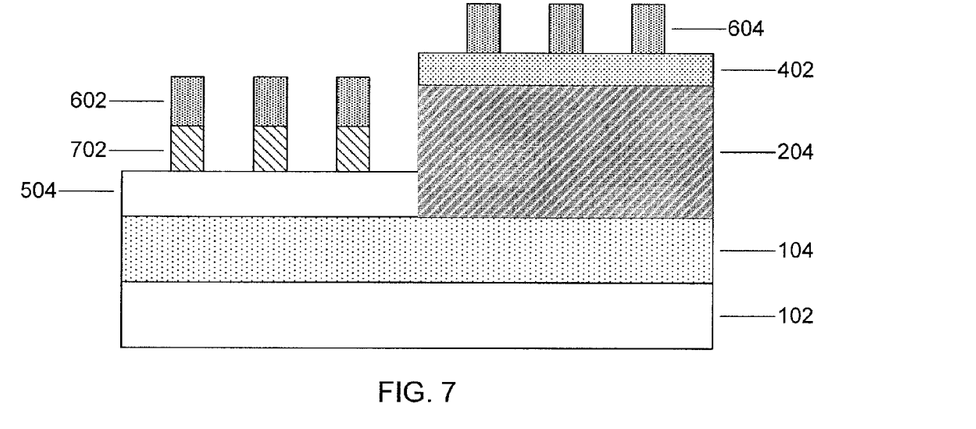
FIG. 7 is a cross-sectional view of an oxide etch in the formation of a decoupling capacitor in accordance with the present principles.

Referring now to FIG. 7, an etch is performed on oxide layer 502, establishing oxide fins 702 under the FET masks 602. The etch may be performed using an anisotropic etch such as, e.g., RIE, to remove only material from the oxide layer 502 without affecting the masking layer 402 or the underlying semiconductor layers 504 and 204.

Figure 8:
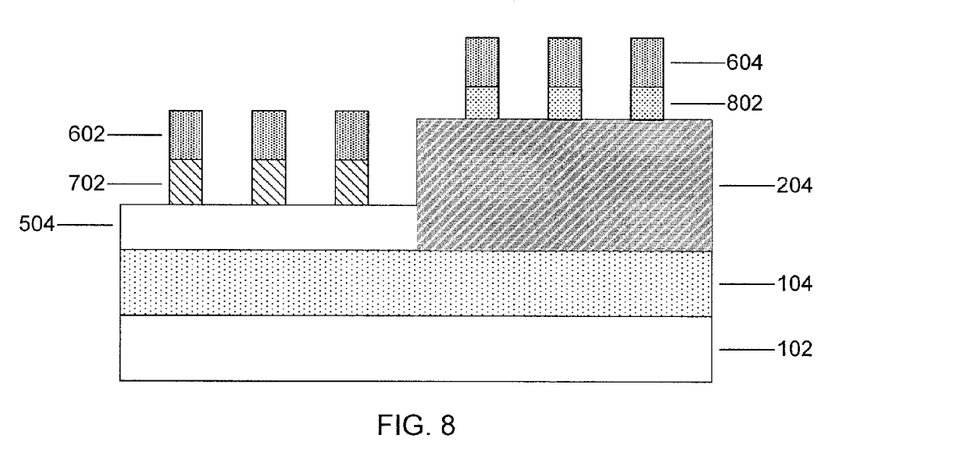
FIG. 8 is a cross-sectional view of a mask etch in the formation of a decoupling capacitor in accordance with the present principles.

Referring now to FIG. 8, an etch is performed on masking layer 402, establishing fins 802 from the masking material under the capacitor masks 604. This etch may again be performed using an anisotropic etch such as, e.g., RIE, to remove only material from the masking layer 402 without affecting the oxide fins 702 or the underlying semiconductor layers 504 and 204.

Figure 9:
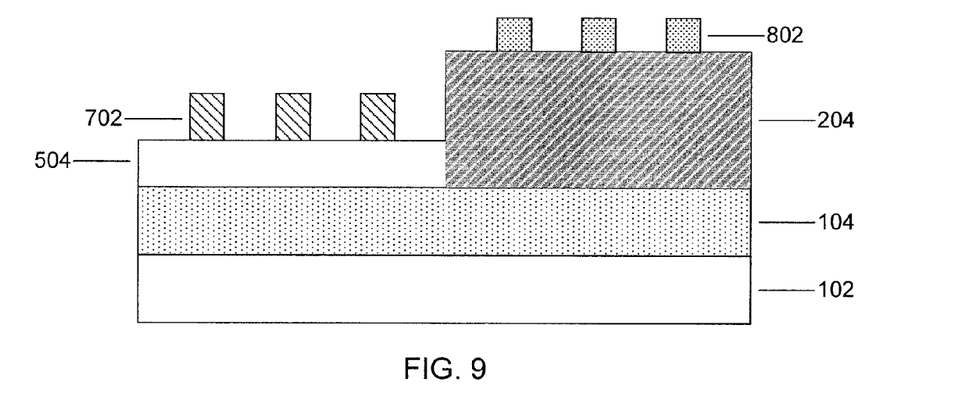
FIG. 9 is a cross-sectional view of photoresist removal in the formation of a decoupling capacitor in accordance with the present principles.

Referring now to FIG. 9, the fin patterning masks 602 and 604 are removed, exposing the oxide fins 702 and the masking fins 802. As noted above, an appropriate solvent is used in accordance with the photoresist material selected. For example, in the case of SU-8, gamma butyrolactone may be used as a solvent.

Figure 10:
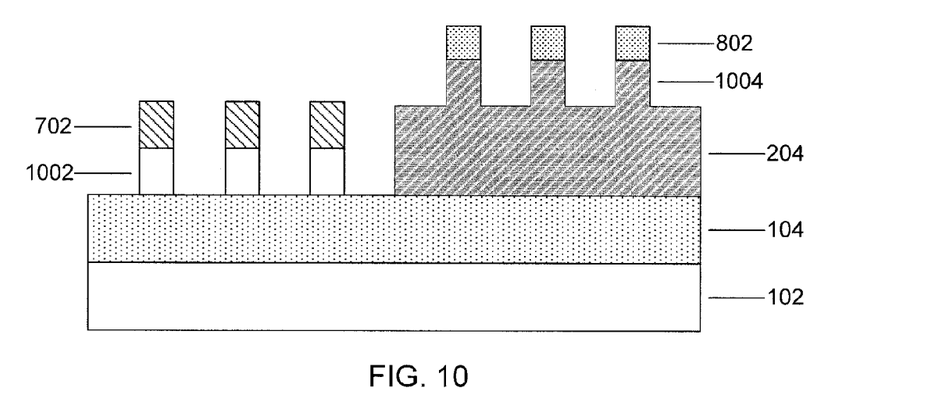
FIG. 10 is a cross-sectional view of a timed, anisotropic semiconductor etch in the formation of a decoupling capacitor in accordance with the present principles.

Referring now to FIG. 10, a semiconductor etch is performed that exposes undoped fins 1002 and doped fins 1004. A timed, anisotropic etch such as, e.g., RIE, may be used to etch both sets of fins 1002 and 1004 by the same amount. Following the exemplary embodiment described above, the anisotropic etch could be timed to remove about 30 nm of material, leaving the FET fins 1002 and capacitor fins 1004 having a height of about 30 nm. The FET fins 1002 may be resting directly on insulator layer 104, while the capacitor fins 1004 rest on the remainder of the doped semiconductor layer 204, which has an exemplary thickness of about 60 nm.

Figure 11:
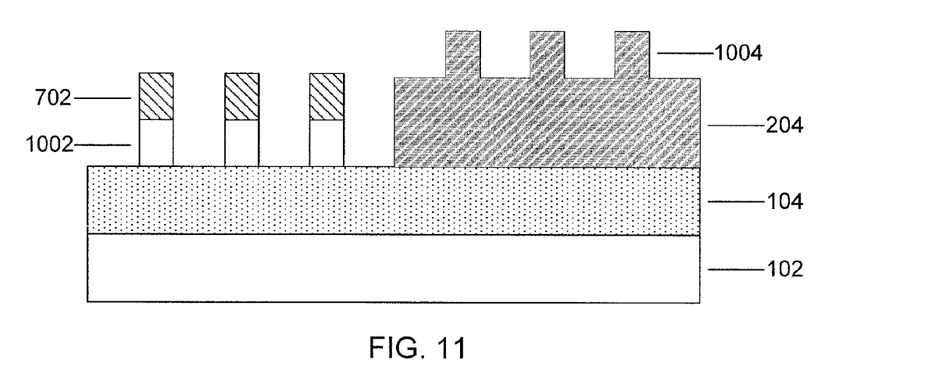
FIG. 11 is a cross-sectional view of a mask removal step in the formation of a decoupling capacitor in accordance with the present principles.

Referring now to FIG. 11, the masking fins 802 are removed. The removal of the masking material of fins 802 may be accomplished using any appropriate etching process, including, e.g., a wet or dry etch that selectively removes the mask material without affecting the surrounding or underlying materials. This exposes the tops of the doped semiconductor fins 1004, such that the fins 1004 may be used in the decoupling capacitor.

Figure 12:
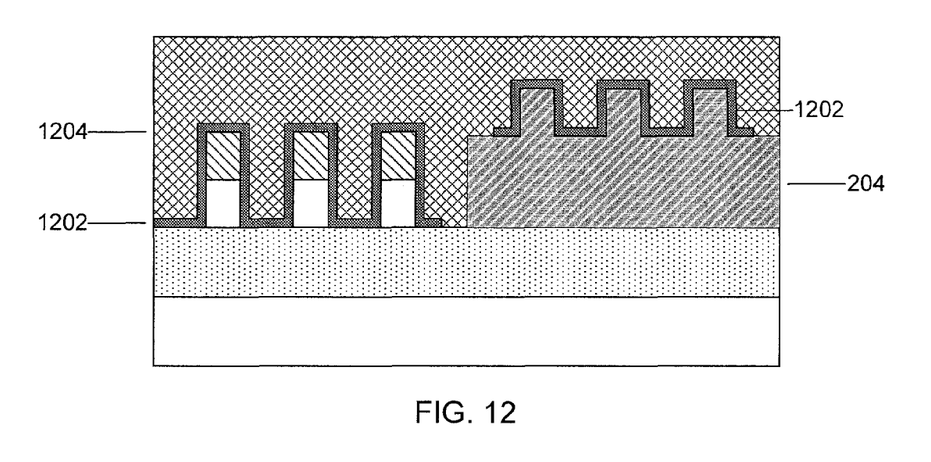
FIG. 12 is a cross-sectional view of a gate stack step formation of a decoupling capacitor in accordance with the present principles.

Referring now to FIG. 12, a gate stack process is performed. A thin chemical oxide is applied over the features, and may be about 1 nm thick. A high-k dielectric 1202 is applied over the fins and may be formed from, e.g., hafnium oxide. A work function metal is then applied to the FET fins 1002/702, which determines the threshold voltage of the FET. A fill material 1204 is then applied, surrounding the fins and the dielectric 1202. The fill material 1204 may be any appropriate gate material including, for example, polysilicon. Because the work function metal and the chemical oxide are not needed for the operation of the decoupling capacitor, they are not shown in the figures for the sake of simplicity.

Figure 13:
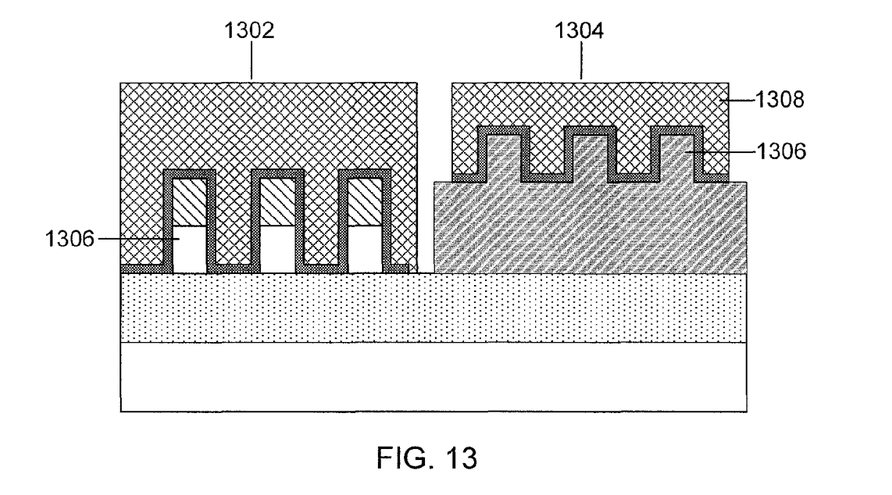
FIG. 13 is a cross-sectional view of a device separation step in the formation of a decoupling capacitor in accordance with the present principles.

Referring now to FIG. 13, gate patterning is performed to separate out devices. The finFETs 1302 are separated out from the decoupling capacitors 1304 using any appropriate etching. For example, an anisotropic RIE may be used to remove the fill material 1204 around devices 1302 and 1304. During operation, the fins 1306 form one electrical terminal of the decoupling capacitor 1304, while the etched fill material 1308 forms the second electrical terminal. The finned structure of the decoupling capacitor 1304 allows for increased capacitance over existing structures, with the high-k dielectric 1202 separating the two conductive regions.

Figure 14:
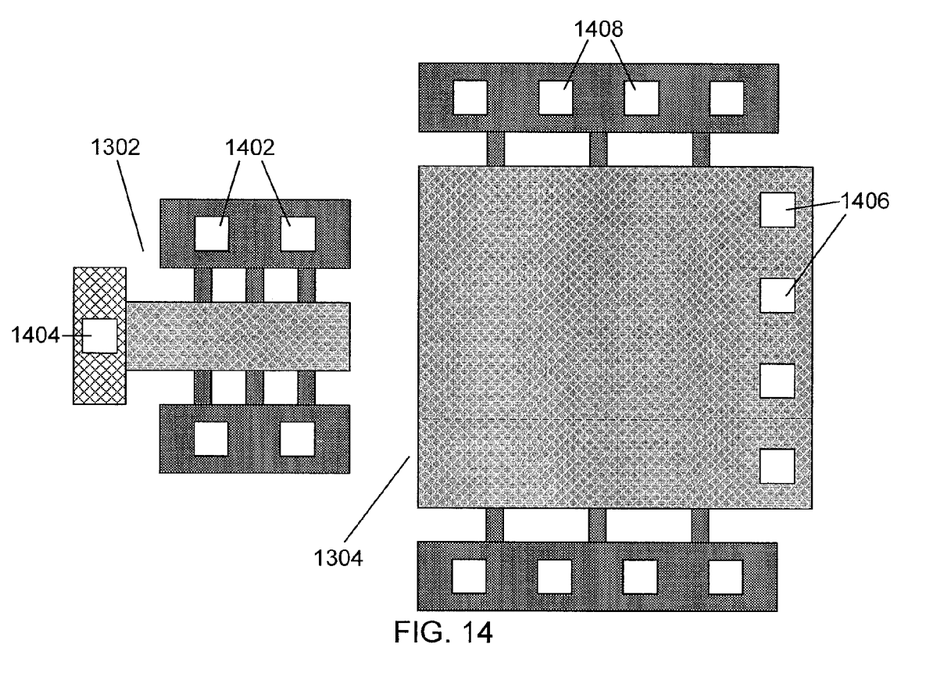
FIG. 14 is a top-down view of a fin field effect transistor and a decoupling capacitor as formed in accordance with the present principles.

Referring now to FIG. 14, a top-down view of finFET 1302 and decoupling capacitor 1304 is shown. Source and drain contacts 1402 and gate contacts 1404 are established on the finFET 1302 to allow electrical connection for device operation. Similarly, contacts 1406 and 1408 are established on decoupling capacitor 1304. Contacts may be formed on the finFET 1302 and the decoupling capacitor 1304 using any appropriate process including, e.g., annealing the base material with a metal to produce a conductive material such as a silicide.

Although the finFET 1302 and the capacitor 1304 are shown as being located next to one another, it is contemplated that the decoupling capacitor 1304 may be located anywhere on a chip, in conjunction with any other device element or standing alone.

Figure 15:
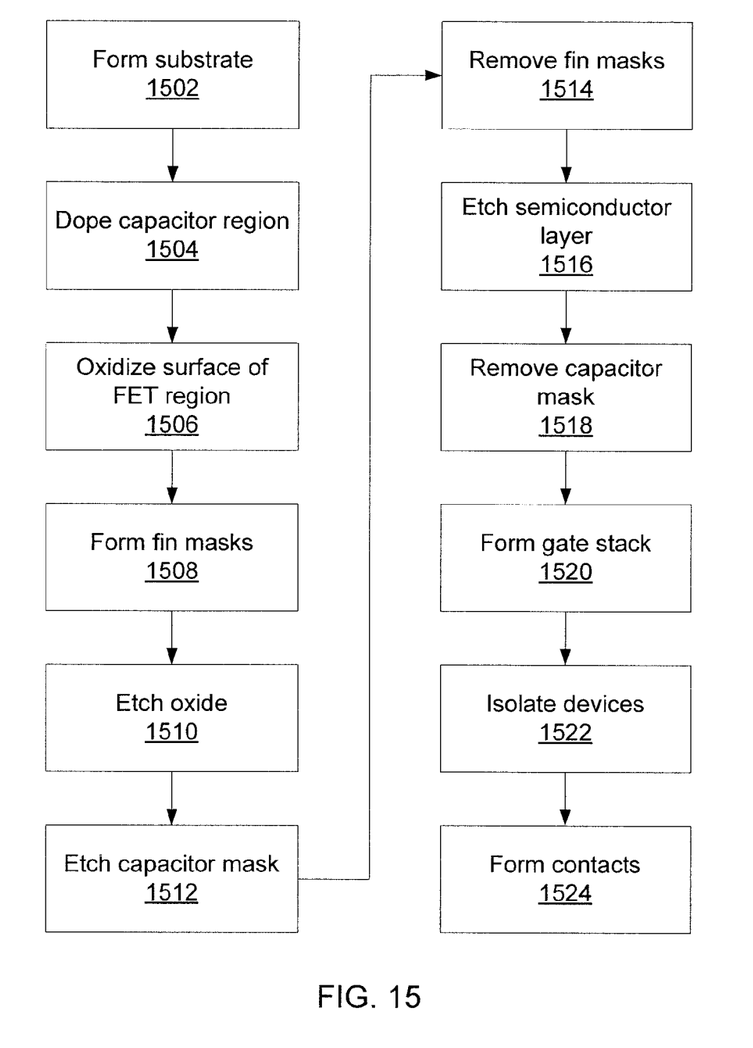
FIG. 15 is a block/flow diagram of a decoupling capacitor fabrication process according to the present principles is shown.

Referring now to FIG. 15, a block/flow diagram of a decoupling capacitor fabrication process according to the present principles is shown. Block 1502 forms the semiconductor-on-insulator structure described above. The structure is fanned with a semiconductor layer 106 having a thickness greater than the desired final fin height of a fin FET—in the example discussed above, this thickness is about 90 nm. Block 1504 dopes a capacitor region of the substrate. Well doping may be used to implant a dopant during an annealing process and may include either an N-type dopant, such as phosphorous, or a P-type dopant, such as boron.

Block 1506 oxidizes the surface of the semiconductor layer 106 in a FET region. Oxidation may be performed by exposing the silicon layer 106 to a concentrated oxygen gas or to an oxidizing liquid, such as water. Thermal oxidation may be used, which forces the oxidizing agent to diffuse into the surface at a high temperature. For example, in the case of forming a silicon dioxide, thermal oxidation may be performed at a temperature between about 800 and 1200 degrees Celsius. This produces an oxidized layer 502 formed from, e.g., silicon dioxide. The oxidation process causes growth in the top layer 502, so the thickness of the oxidized layer 502 may be adjusted by, e.g., a wet etch. In the present example, the thickness of the oxide layer 502 may be about 10-30 nm. The oxidation process leaves a portion of unoxidized material 504 beneath the oxidized layer 502 having an exemplary thickness of about 30 nm.

Block 1508 forms fin photoresist masks 602 and 604 over FET regions and capacitor regions to protect the underlying material during fin formation. The photoresist masks 602 and 604 may be formed from any appropriate photoresist material such as, e.g., poly(methyl methacrylate) or SU-8. Block 1510 etches the oxide layer 502, forming oxide fins 702 under the fin photoresist masks 602. The etch may be performed using an anisotropic etch such as, e.g., RIE, to remove only material from the oxide layer 502 without affecting other layers and materials.

Block 1512 etches a capacitor masking layer 402. This etch may be performed using an anisotropic etch such as, e.g., RIE, to remove only material from the masking layer 402 without affecting the oxide fins 702 or the underlying semiconductor layers 504 and 204. Block 1514 removes fin masks 602 and 604 to expose oxide fins 702 and masking fins 802. An appropriate solvent is used in accordance with the particular photoresist employed. For example, in the case of SU-8, gamma butyrolactone may be used as a solvent.

Block 1516 etches the remaining semiconductor material of layer 106, exposing undoped fins 1002 and doped fins 1004. A timed, anisotropic etch such as, e.g., RIE, may be used to etch both sets of fins 1002 and 1004 by the same amount. The anisotropic etch may be timed to remove about 30 nm of material, leaving the FET fins 1002 and capacitor fins 1004 having a height of about 30 nm. This etch leaves a portion of doped semiconductor layer 204 with an exemplary thickness of about 60 nm. Block 1518 removes the capacitor masking fins 802 using any appropriate etching process that may include, e.g., a wet or dry etch that selectively removes the mask material without affecting the surrounding or underlying materials. This exposes the tops of the doped semiconductor fins 1004, such that the fins 1004 may be used in the decoupling capacitor.

Block 1520 forms a gate stack over the fins 1002 and 1004. The gate stack includes a thin chemical oxide that may be about 1 nm thick, a high-k dielectric 1202 that may be formed from, e.g., hafnium oxide a work function metal, which determines the threshold voltage of the FET, and a fill material 1204 surrounding the fins and the dielectric 1202 that may be any appropriate gate material including, for example, polysilicon. Block 1522 isolates the FET 1302 and decoupling capacitor 1304 by etching the gate material 1204 using, e.g., an anisotropic RIE. Block 1524 forms terminals for the FET 1302 and the decoupling capacitor 1304 by forming, e.g., a silicide at the points of electrical contact.

Figure 16:
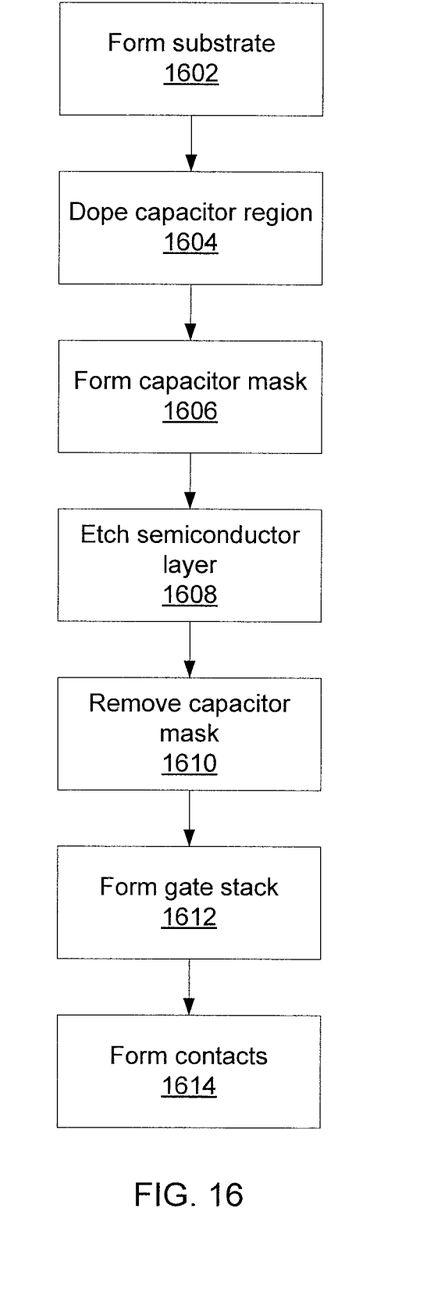
FIG. 16 is a block/flow diagram of a decoupling capacitor fabrication process according to the present principles is shown.

Referring now to FIG. 16, an alternative process is shown for forming standalone fin-based decoupling capacitors. Certain steps may be omitted if corresponding fin structures are not being formed. Block 1602 forms a substrate as described above, but optionally omits the mask layer 108. Block 1604 dopes the semiconductor layer 106 as above, using for example a well doping anneal to implant dopant of any appropriate type. Block 1606 forms a capacitor fin mask 802. This mask may be formed by etching a mask layer 108 that was formed as part of block 1602, or it may be applied after doping. Regardless of the timing of the deposition, the mask is etched to form fin masks 802.

Block 1608 etches the semiconductor layer 106, exposing doped fins 1004. Any appropriate etch may be used including, e.g., an anisotropic etch such as RIE. The etch may be timed to remove about 30 nm of material, leaving the capacitor fins 1004 having a height of about 30 nm, while the remainder of the doped material 204 has a height of 60 nm. Block 1610 removes the capacitor mask 802 using an appropriate solvent.

Block 1612 forms a "gate stack." In the absence of FET structures, only the high-k dielectric layer 1202 and the gate material 1308 is needed to form the capacitor—the chemical oxide layer and the work function metal may be omitted. Block 1614 forms contacts 1406 and 1408 to allow for electrical connections to the decoupling capacitor. It should be noted that the capacitor in this process may be isolated from other circuit components using any appropriate method including, for example, shallow trench isolation and gate material patterning as discussed above.

Having described preferred embodiments of a system and method for MOS capacitors with a finFET process (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A method for capacitor fabrication, comprising:
   doping a capacitor region of a top semiconductor layer in a semiconductor-on-insulator substrate;
   partially etching the top semiconductor layer around the doped capacitor region to partially expose sidewalls of the doped semiconductor layer;

partially etching the doped semiconductor layer to produce a first terminal layer comprising a plurality of doped semiconductor fins on a remaining base of doped semiconductor, wherein said partial etch of the doped semiconductor layer removes remaining material from the top semiconductor layer around the doped capacitor region to fully expose the sidewalls of the doped semiconductor layer;

forming a dielectric layer over the first terminal layer; and forming a second terminal layer over the dielectric layer having a shape that conforms to the doped semiconductor fins.

2. The method of claim 1, further comprising:
forming a fin mask by patterning a masking material on the doped semiconductor layer; and
removing the fin mask after partially etching the semiconductor layer.

3. The method of claim 1, wherein partially etching the doped semiconductor layer etches the doped semiconductor fins to half a height of the remaining base or less.

4. The method of claim 1, wherein partially etching the doped semiconductor layer etches the doped semiconductor fins to a height greater than a height of an undoped transistor fin elsewhere on the substrate.

5. The method of claim 1, further comprising forming electrical contacts on the first terminal layer and the second terminal layer respectively.

6. The method of claim 1, wherein partially etching the semiconductor layer includes performing a timed anisotropic etch.

7. The method of claim 1, wherein doping comprises implanting an n-type dopant.

8. The method of claim 1, wherein doping comprises implanting a p-type dopant.

9. A method for capacitor fabrication, comprising:
doping a capacitor region of a semiconductor layer in a semiconductor-on-insulator (SOI) substrate;
oxidizing a surface of a transistor region of the semiconductor layer to produce an oxidized layer;
etching the oxidized layer to produce fins of oxidized semiconductor;
partially etching the semiconductor layer around the doped capacitor region to partially expose sidewalls of the doped semiconductor layer;
partially etching the semiconductor layer to produce a first terminal layer in the capacitor region comprising a plurality of doped semiconductor fins on a remaining base of doped semiconductor and to produce undoped semiconductor fins in the transistor region, wherein said partial etch of the doped semiconductor layer removes remaining material from the top semiconductor layer around the doped capacitor region to fully expose the sidewalls of the doped semiconductor layer;
forming a gate stack over the capacitor region and the transistor region that includes a dielectric layer and a gate layer that conforms to the doped semiconductor fins; and
isolating the capacitor region from the transistor region.

10. The method of claim 9, further comprising forming electrical contacts on the first terminal layer and the gate layer of the capacitor region respectively.

11. The method of claim 9, further comprising:
forming a masking layer over the substrate before doping;
forming a fin mask on the capacitor region and the transistor region respectively by patterning a masking material on the respective regions;
etching the masking layer in the capacitor region; and
removing the fin masks after partially etching the semiconductor layer and etching the oxidized layer.

12. The method of claim 9, wherein partially etching the semiconductor layer etches the doped semiconductor fins to half a height of the remaining base or less.

13. The method of claim 9, wherein partially etching the semiconductor layer etches the undoped semiconductor fins to less than a combined height of the doped semiconductor fins and the remaining base.

14. The method of claim 9, wherein partially etching the semiconductor layer includes performing a timed anisotropic etch.

15. The method of claim 9, wherein doping the capacitor region includes masking the transistor region during doping.

16. The method of claim 9, wherein oxidizing the surface of the transistor region includes etching the oxidized surface to a predetermined thickness.

17. The method of claim 9, wherein doping comprises implanting an n-type dopant.

18. The method of claim 9, wherein doping comprises implanting a p-type dopant.

19. The method of claim 9, wherein the dielectric layer is formed with a high-k dielectric.

20. A method for capacitor fabrication, comprising:
doping a capacitor region of a semiconductor layer in a semiconductor-on-insulator (SOI) substrate that has a masking layer;
oxidizing a surface of a transistor region of the semiconductor layer to produce an oxidized layer;
forming a fin mask on the capacitor region and the transistor region respectively by patterning a masking material on the respective regions;
etching the oxidized layer to produce fins of oxidized semiconductor;
etching the masking layer in the capacitor region;
partially etching the semiconductor layer around the doped capacitor region to partially expose sidewalls of the doped semiconductor layer;
partially etching the semiconductor layer with a timed anisotropic etch to produce a first terminal layer in the capacitor region comprising a plurality of doped semiconductor fins on a remaining base of doped semiconductor and to produce undoped semiconductor fins in the transistor region, wherein said partial etch of the doped semiconductor layer also removes remaining material from the top semiconductor layer around the doped capacitor region to fully expose the sidewalls of the doped semiconductor layer;
removing the fin masks;
forming a gate stack over the capacitor region and the transistor region that includes a dielectric layer and a gate layer having a shape that conforms to the doped semiconductor fins;
isolating the capacitor region from the transistor region; and
forming electrical contacts on the first terminal layer and the gate layer of the capacitor region respectively.

* * * * *